(12) United States Patent
Kameda (10) Patent No.: US 11,664,729 B2
(45) Date of Patent: May 30, 2023

(54) POWER-SUPPLY MODULE AND DC-DC CONVERTER

(71) Applicants: Kabushiki Kaisha Toshiba, Tokyo (JP); Toshiba Electronic Devices & Storage Corporation, Tokyo (JP)

(72) Inventor: Mitsuhiro Kameda, Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 57 days.

(21) Appl. No.: 17/199,597

(22) Filed: Mar. 12, 2021

(65) Prior Publication Data

US 2022/0077777 A1    Mar. 10, 2022

(30) Foreign Application Priority Data

Sep. 10, 2020   (JP) .............................. JP2020-152084

(51) Int. Cl.
*H02M 3/158*    (2006.01)
*H01L 25/16*    (2023.01)

(52) U.S. Cl.
CPC ............ *H02M 3/158* (2013.01); *H01L 25/16* (2013.01)

(58) Field of Classification Search
CPC .. H02M 3/158; H02M 3/1582; H02M 3/1586; H02M 3/156; H02M 3/07; H01L 25/16; H01L 25/162
See application file for complete search history.

(56) References Cited

U.S. PATENT DOCUMENTS

| | | | |
|---|---|---|---|
| 5,691,556 A | 11/1997 | Saito et al. | |
| 7,403,397 B2 | 7/2008 | Matsumoto et al. | |
| 8,917,507 B2 | 12/2014 | Nagasawa | |
| 9,748,837 B1* | 8/2017 | Kose | H02M 3/07 |
| 10,033,275 B2 | 7/2018 | Ishii et al. | |
| 2005/0189566 A1 | 9/2005 | Matsumoto et al. | |
| 2005/0213280 A1* | 9/2005 | Azrai | H01L 24/05 |
| | | | 361/271 |
| 2008/0122812 A1* | 5/2008 | Park | G09G 3/3648 |
| | | | 345/204 |
| 2009/0256627 A1* | 10/2009 | Hernandez-Garduno | |
| | | | H02M 3/073 |
| | | | 327/536 |
| 2009/0315615 A1* | 12/2009 | Likhterov | H02M 3/07 |
| | | | 327/536 |
| 2012/0033385 A1 | 2/2012 | Nagasawa | |

(Continued)

FOREIGN PATENT DOCUMENTS

| | | |
|---|---|---|
| JP | 1978-018986 A | 2/1978 |
| JP | H06-334119 A | 12/1994 |

(Continued)

*Primary Examiner* — Nguyen Tran
(74) *Attorney, Agent, or Firm* — Allen & Overy LLP (57) ABSTRACT

A power-supply module according to the present embodiment comprises a capacitor and a switching circuit. The switching circuit comprises a plurality of switching elements, and is configured to charge the capacitor by using an input voltage with a combination of connection and disconnection of the switching elements, and output an output voltage that is different from the input voltage. The capacitor is a silicon capacitor, and each of the switching elements is a transistor.

14 Claims, 8 Drawing Sheets

(56) References Cited

U.S. PATENT DOCUMENTS

| | | | | |
|---|---|---|---|---|
| 2013/0094157 A1* | 4/2013 | Giuliano | ................ | H01L 25/16 |
| | | | | 361/748 |
| 2016/0126832 A1* | 5/2016 | Zhou | ....................... | H03F 3/191 |
| | | | | 327/536 |
| 2019/0167989 A1* | 6/2019 | Guyon | ............... | A61N 1/37288 |

FOREIGN PATENT DOCUMENTS

| | | | |
|---|---|---|---|
| JP | 2004-222486 | A | 8/2004 |
| JP | 2006-296170 | A | 10/2006 |
| JP | 2010-267945 | A | 11/2010 |
| JP | 2012-244745 | A | 12/2012 |
| JP | 2018-061363 | A | 4/2018 |
| WO | 2015-019519 | A1 | 2/2015 |

* cited by examiner

POWER-SUPPLY MODULE AND DC-DC CONVERTER

CROSS-REFERENCE TO RELATED APPLICATIONS

This application is based upon and claims the benefit of priority from the prior Japanese Patent Application No. 2020-152084, filed on Sep. 10, 2020 the entire contents of which are incorporated herein by reference.

FIELD

Embodiments of the present invention relate to a power-supply module and a DC-DC converter.

BACKGROUND

Along with increases in power consumption of controllers and the like, required power density increases, and power density required for power-supply modules to be mounted on a board also increases. Meanwhile, power-supply modules and DC-DC converters have been downscaled and made thinner.

However, in order to satisfy the capacity required for a power-supply module, an electrolytic capacitor or a multi-layered ceramic capacitor that are generally used therein needs to have a predetermined or larger volume, and thus it becomes difficult to downscale and make thinner the power-supply module.

DETAILED DESCRIPTION

A power-supply module according to the present embodiment comprises a capacitor and a switching circuit. The switching circuit comprises a plurality of switching elements, and configured to charge the capacitor by using an input voltage with a combination of connection and disconnection of the switching elements, and output an output voltage that is different from the input voltage. The capacitor is a silicon capacitor, and each of the switching elements is a transistor.

A power-supply module and a DC-DC converter according to embodiments of the present invention will now be explained in detail with reference to the accompanying drawings. The embodiments described below are only examples of the embodiments of the present invention and it is not to be understood that the present invention is limited to these embodiments. In the drawings referred to in the embodiments, same parts or parts having identical functions are denoted by like or similar reference characters and there is a case where redundant explanations thereof are omitted. Further, for convenience of explanation, there are cases where dimensional ratios of the parts in the drawings are different from those of actual products and some part of configurations is omitted from the drawings.

Embodiment

Figure 1:
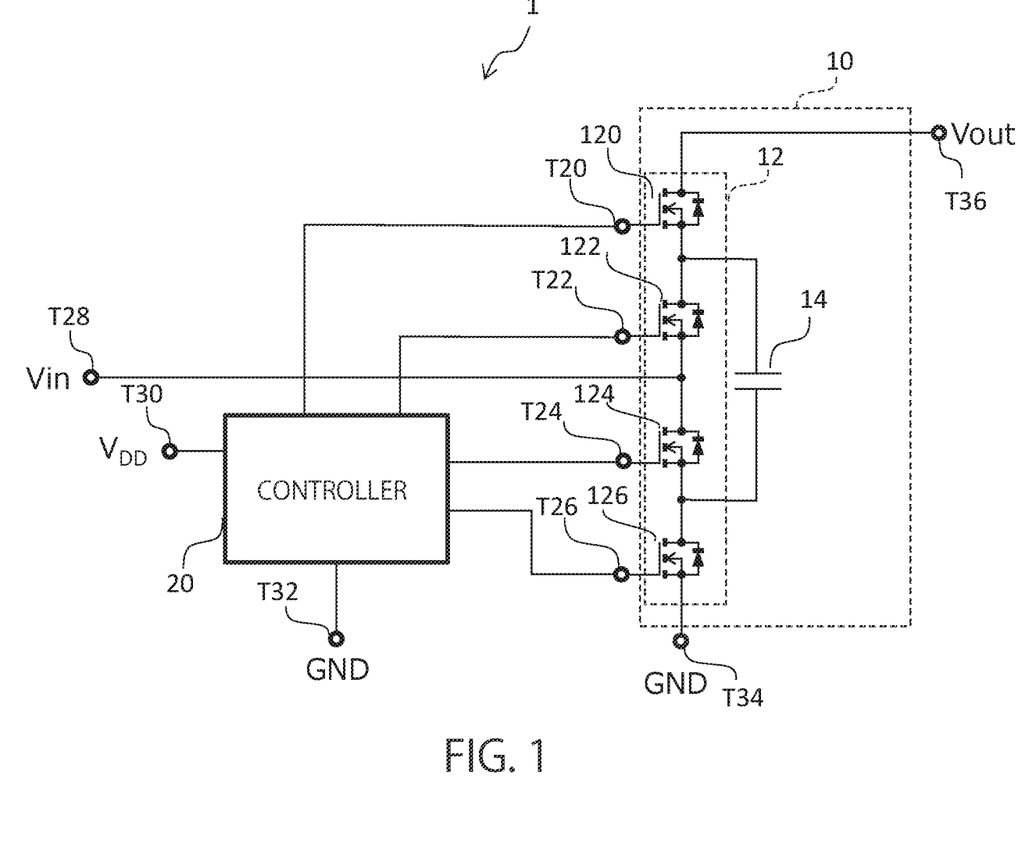
FIG. 1 is a block diagram illustrating a configuration of a DC-DC converter according to an embodiment.

FIG. 1 is a block diagram illustrating a configuration of a DC-DC converter 1 according to an embodiment. As illustrated in FIG. 1, the DC-DC converter 1 according to the present embodiment is a power supply that converts an input voltage Vin into an output voltage Vout, and includes a power-supply module 10 and a controller 20. FIG. 1 further illustrates terminals T20 to T36.

The power-supply module 10 is a power-supply module capable of converting the input voltage Vin into the output voltage Vout, and includes a switching circuit 12 and a capacitor 14. The switching circuit 12 has one end connected to the terminal T34, and the other end connected to the terminal T36. The terminal T34 is a low-potential-side terminal, and is connected to a grounding potential GND. The terminal 36 outputs an output voltage Vout. In the following descriptions, for easier understanding, the grounding potential GND is assumed to be 0 volt.

The switching circuit 12 includes a first switching element 120, a second switching element 122, a third switching element 124, and a fourth switching element 126. As illustrated in FIG. 1, from the terminal T36 to the terminal T34, the first switching element 120, the second switching element 122, the third switching element 124, the fourth switching element 126 are connected in series in this order. Each of the first switching element 120, the second switching element 122, the third switching element 124, and the fourth switching element 126 has a thickness of approximately 20 to 300 μm. Each of the first switching element 120, the second switching element 122, the third switching element 124, and the fourth switching element 126 according to the present embodiment is configured to have a thickness of, for example, 50 μm.

In the respective gates of the first switching element 120, the second switching element 122, the third switching element 124, and the fourth switching element 126, gate signals are input from the controller 20 through the corresponding terminals T20 to T26. That is, the terminals T20 to T26 are connected to the controller 20.

One end (a drain side of a MOSFET) of the first switching element 120 is connected to the terminal T36 that is a positive terminal. One end (a drain side of a MOSFET) of the second switching element 120 is connected to the other end (a source side of the MOSFET) of the first switching element 120. One end (a drain side of a MOSFET) of the third switching element 124 is connected to the other side (a source side of the MOSFET) of the second switching element 122. One end (a drain side of a MOSFET) of the fourth switching element 12 is connected to the other end (a source side of the MOSFET) of the third switching element 124. The other end (a source side of the MOSFET) of the fourth switching element 126 is connected to the terminal T34 that is a negative terminal.

The other end of the second switching element 122 and one end of the third switching element 124 are connected to the terminal T28.

The capacitor 14 is, for example, a silicon capacitor, and has a thickness of approximately 20 to 300 μm. The thickness of the silicon capacitor according to the present embodiment is made to correspond to the thickness of the first switching element 120 to the fourth switching element 126. The capacitor 14 is configured to have a thickness of 50 μm, for example. With this configuration, when the capacitor 14, the first switching element 120, the second switching element 122, the third switching element 124, and the fourth switching element 126 are configured on the same substrate or the same film, they are substantially the same in height from a substrate surface or a film surface.

One end of the capacitor 14 is connected to a connection point between the first switching element 120 and the second switching element 122, and the other end thereof is connected to a connection point between the third switching element 124 and the fourth switching element 126.

The controller 20 generates gate signals for the first switching element 120, the second switching element 122, the third switching element 124, and the fourth switching element 126, and supplies the gate signals to the first switching element 120 to the fourth switching element 126 through the terminals T20 to T26. The controller 20 is configured to include a CPU, for example.

Figure 2:
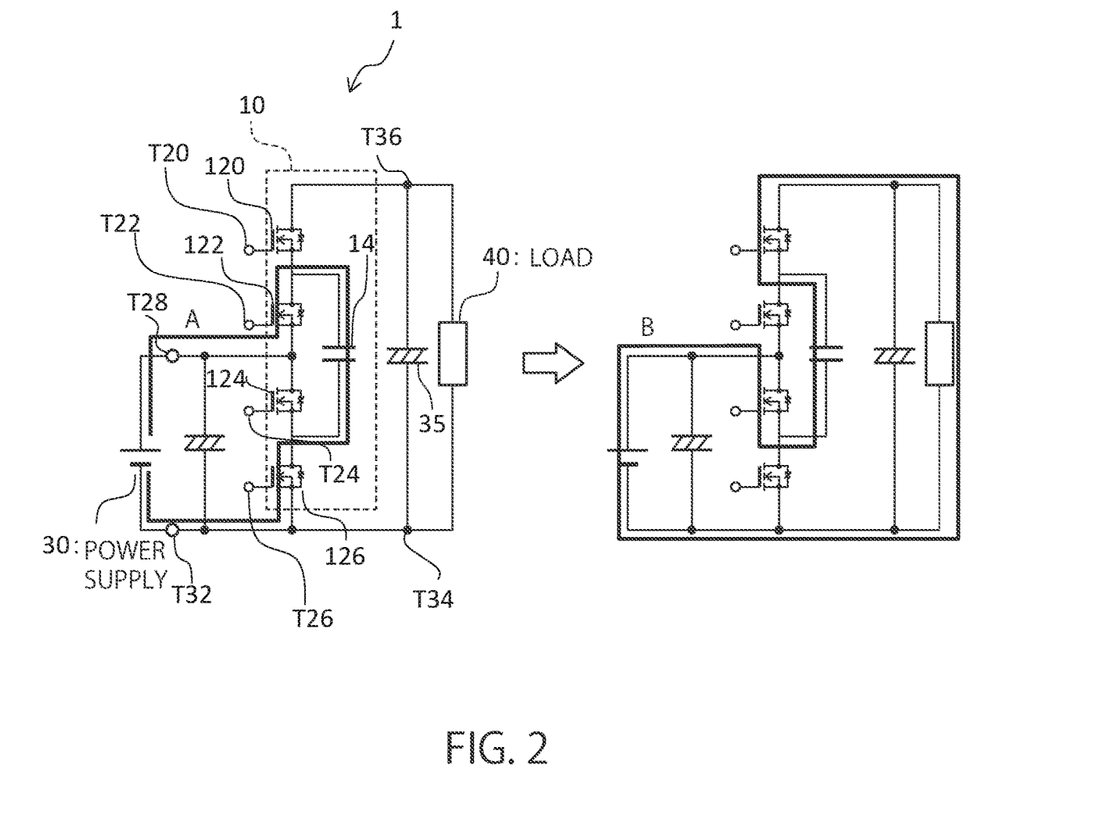
FIG. 2 is a diagram illustrating an example of a step-up operation of the DC-DC converter.

FIG. 2 is a diagram illustrating an example of a step-up operation of the DC-DC converter 1. As illustrated in the left diagram of FIG. 2, a power supply 30 is connected between the terminal T28 and the terminal T32, and an electrolytic capacitor 35 and a load 40 are connected between the terminal T34 and the terminal T36. The electrolytic capacitor 35 is used to stabilize a voltage to be supplied to the load 40.

As illustrated in the left diagram of FIG. 2, first, when the second switching element 122 and the fourth switching element 126 are connected (turned on) and the first switching element 120 and the third switching element 124 are disconnected (turned off), a current flows through a route A and the capacitor 14 is charged. Next, when the second switching element 122 and the fourth switching element 126 are disconnected (turned off) and the first switching element 120 and the third switching element 124 are connected (turned on), a voltage twice as high as the input voltage Vin is output to the output voltage Vout through a route B. With this operation, the DC voltage Vin can be converted into a different DC voltage Vout. In the present embodiment, while an example of the step-up operation has been described, the embodiment is not limited thereto, and a step-down operation may be performed. Further, in the DC-DC converter according to the present embodiment, while the first switching element 120, the second switching element 122, the third switching element 124, and the fourth switching element 126 are connected in series, the configuration is not limited thereto. For example, it is permissible to use a step-up DC-DC converter including a reactance, a switching element, and a capacitor, a step-down DC-DC converter including a reactance, a switching element, and a capacitor, and the like.

Figure 3:
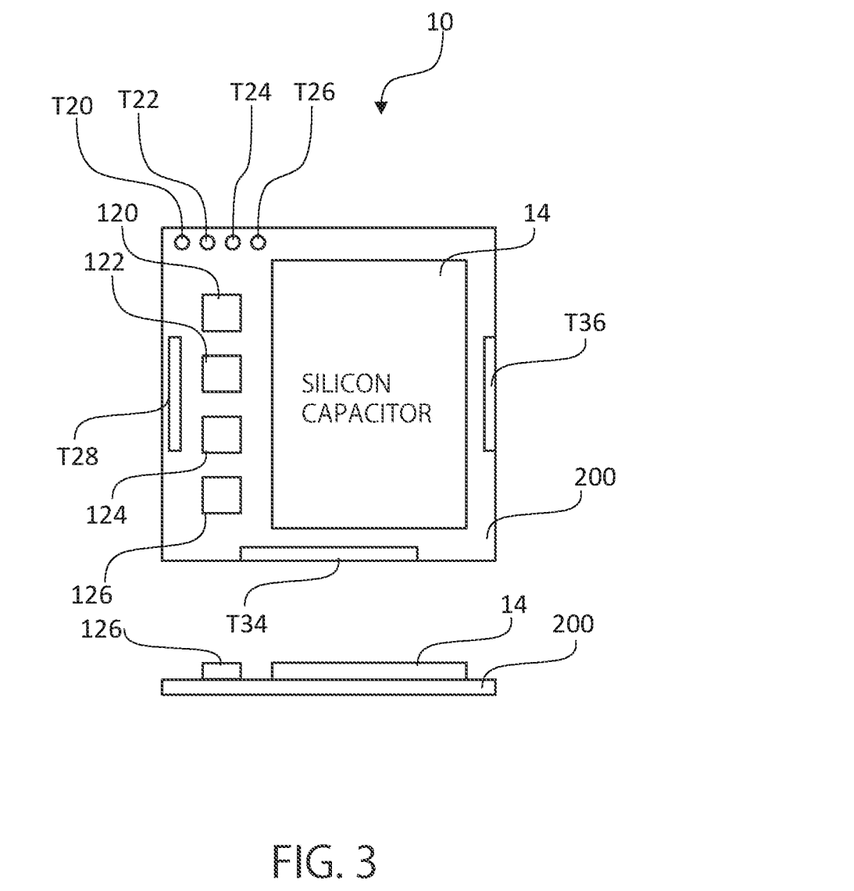
FIG. 3 is a diagram illustrating an example in which a power-supply module is configured on a substrate.

FIG. 3 is a diagram illustrating an example in which the power-supply module 10 is configured on the substrate 200.

The upper diagram is a top view, and the lower diagram is a side view. As illustrated in FIG. 3, the controller 20 is mounted on a substrate that is different from those of the switching circuit 12 and the capacitor 14. Each of the switching circuit 12 and the capacitor 14 is formed in a planar shape.

With this configuration, as described above, without influences from the thickness of the controller 20, thicknesses of the switching circuit 12 and the capacitor 14 can be made to correspond to each other, for example, upper surfaces of these elements can be made flush with each other. As described above, for example, in the example in which the switching circuit 12 consists of a MOSFET, the switching circuit 12 can be configured to have a thickness of approximately 50 μm. When the substrate 200 is configured to have the same thickness as that of the switching circuit 12, the power-supply module 10 can be configured to have a chip thickness of 100 μm, for example. The switching circuit 12 and the capacitor 14 may be covered with an insulating film.

Figure 4:
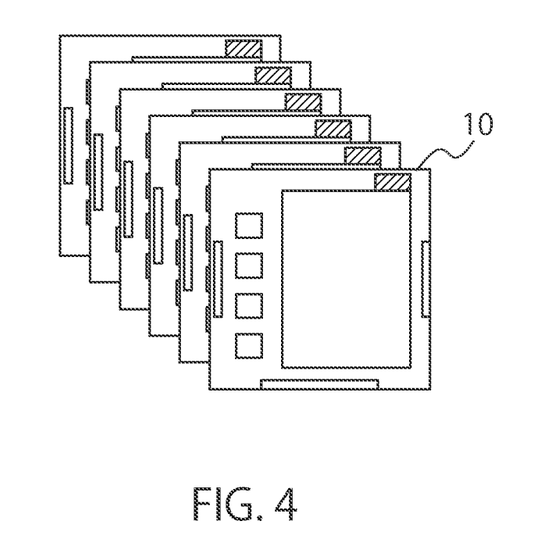
FIG. 4 is a diagram illustrating an example of lamination of the power-supply modules illustrated in FIG. 3.

FIG. 4 is a diagram illustrating an example of lamination of the power-supply modules 10 illustrated in FIG. 3. As illustrated in FIG. 4, the power-supply modules 10 can be laminated in parallel according to required power. In this case, for example, corresponding terminals T20 to T36 can be respectively connected and parallelized. In this manner, the thickness of the power-supply modules 10 (the number of power-supply modules 10 to be laminated) can be adjusted according to the required power. For example, when one power-supply module 10 is sufficient for the required power, the power-supply module 10 is configured to have a thickness of 100 μm. In this manner, power supply can be increased with the number of power-supply modules 10 to be laminated.

Figure 5:
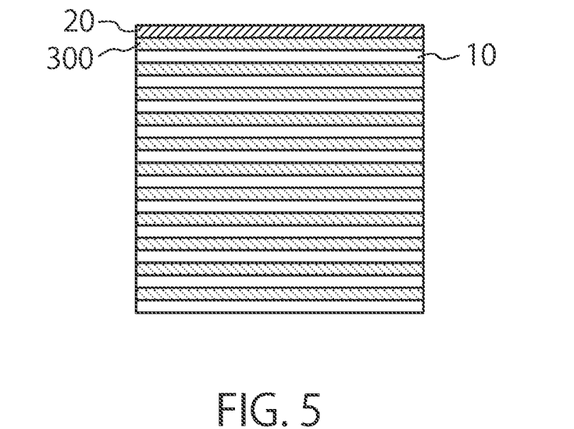
FIG. 5 is a diagram illustrating an example in which the power-supply modules illustrated in FIG. 3 and a controller are laminated.

FIG. 5 is a diagram illustrating an example in which the power-supply modules 10 illustrated in FIG. 3 and the controller 20 are laminated. As illustrated in FIG. 5, the power-supply modules 10 each having the switching circuit 12 and the capacitor 14 arranged therein and the controller 20 are configured in mutually different layers. With this arrangement, it becomes easier to laminate the power-supply modules 10 in parallel according to the required power.

Further, an insulating film 300 is laminated between the power-supply modules 10. The respective terminals T20 to T36 are electrically connected through connecting portions such as via holes.

Figure 6:
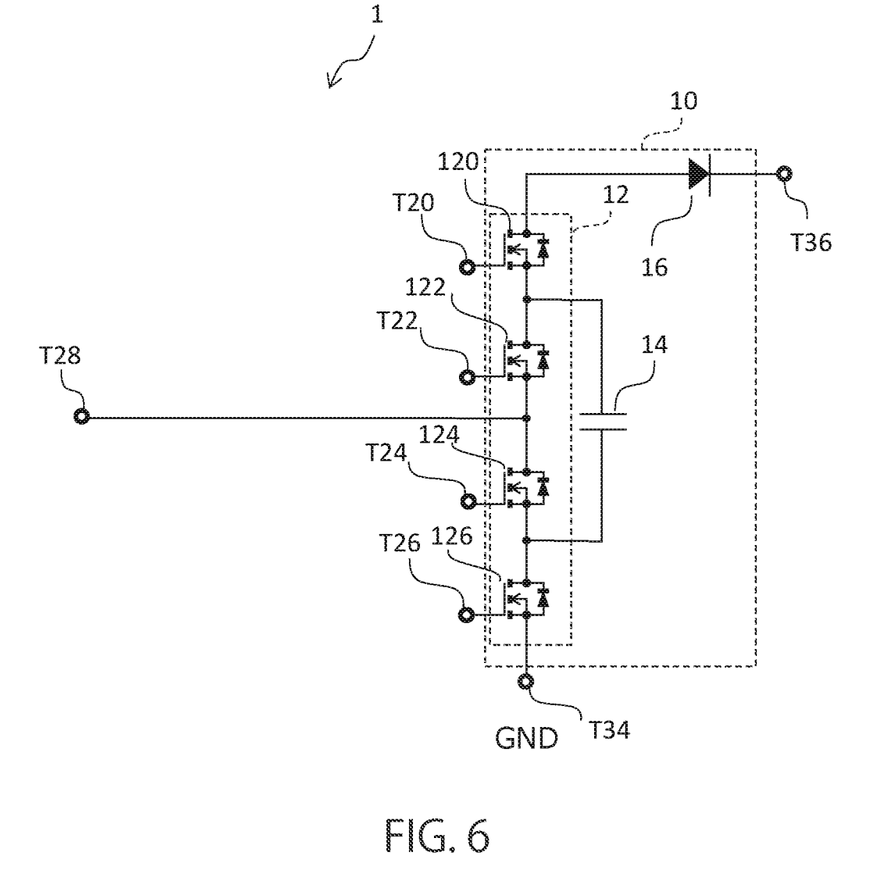
FIG. 6 is a diagram illustrating an example in which a power-supply module having a reverse-flow blocking diode added thereto is configured on a substrate.

FIG. 6 is a diagram illustrating an example in which a power-supply module 10 having a reverse-flow blocking diode 16 added thereto is configured on the substrate 200. Reverse voltages can be prevented by the reverse-flow blocking diode 16. As illustrated in FIG. 6, elements such as a diode may be added to the power-supply module 10 as necessary.

Figure 7:
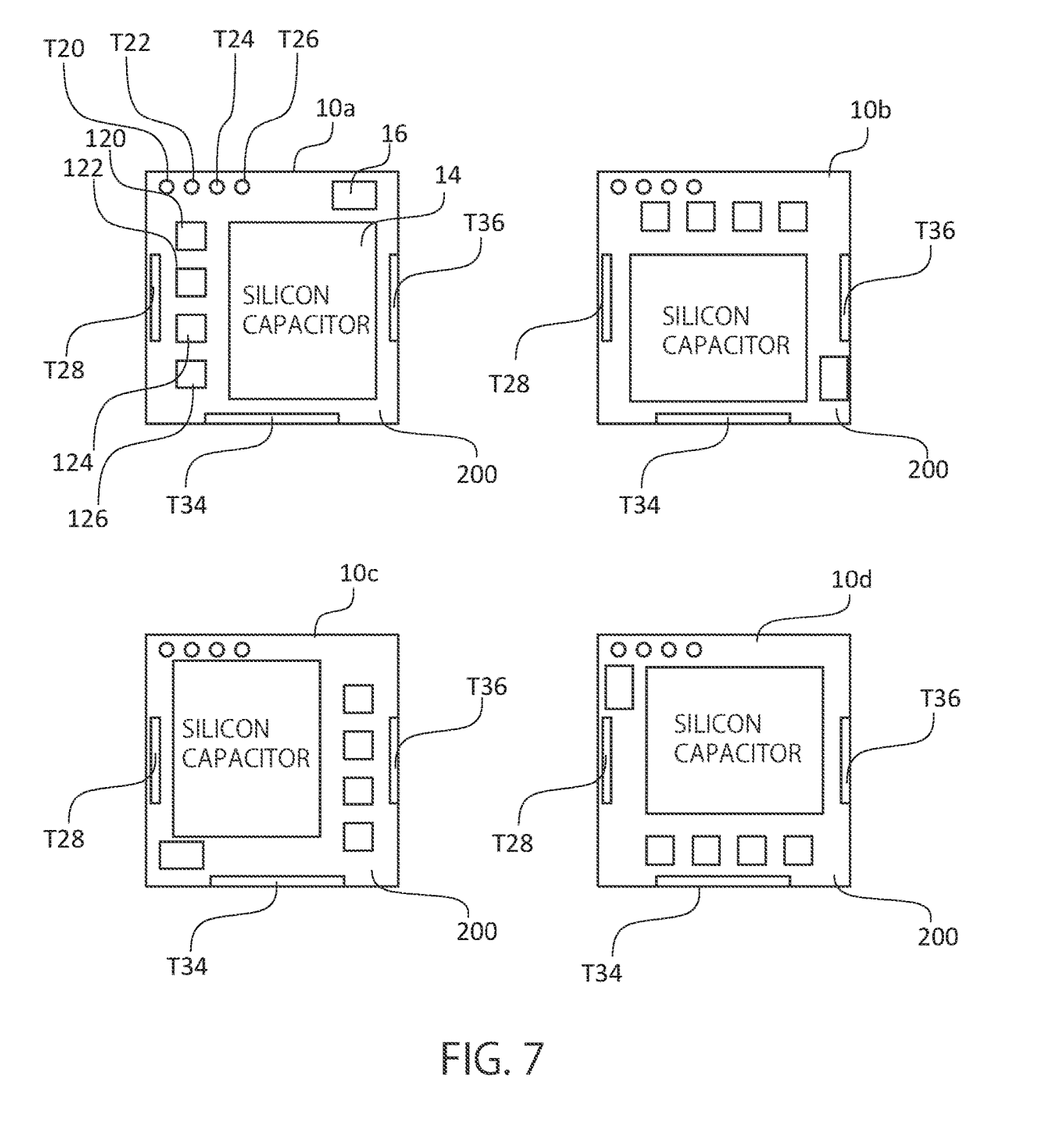
FIG. 7 is a top view illustrating examples in which the power-supply modules illustrated in FIG. 6 are configured on a substrate.

FIG. 7 is a top view illustrating examples in which the power-supply modules 10 illustrated in FIG. 6 are configured on the substrate 200. Power-supply modules 10a to 10d are configured in a similar manner to the power-supply module 10 illustrated in FIG. 6. That is, the power-supply modules 10 are rotated 90 degrees sequentially while the terminals T20 to T36 are at the same positions.

Figure 8:
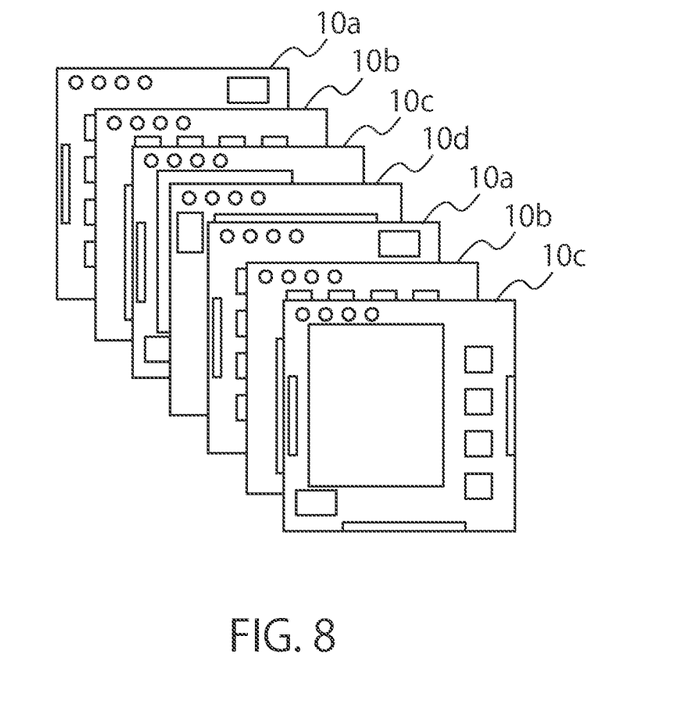
FIG. 8 is a diagram illustrating an example of lamination of the power-supply modules illustrated in FIG. 7.

FIG. 8 is a diagram illustrating an example of lamination of the power-supply modules 10a to 10d illustrated in FIG. 7. In FIG. 8, the switching circuits 12 are arranged so as not to be at the same position between the power-supply modules 10 that are adjacent to each other. Accordingly, heat unevenness can be reduced. Further, the lengths of signal lines connecting the controllers 20 and the switching circuits 12 change according to the positions of the power-supply modules 10*a* and 10*d*, so that the timings of changes in the output voltage of the power-supply modules 10*a* to 10*d* shift from each other. With this configuration, so-called "ripple" can be prevented from occurring.

Figure 9:
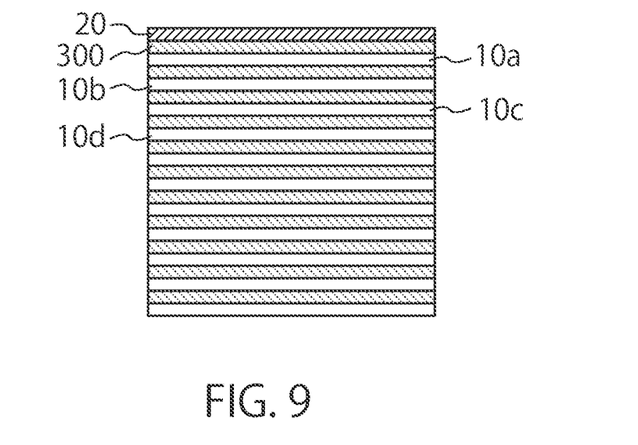
FIG. 9 is a diagram illustrating an example of lamination of the power-supply modules illustrated in FIG. 7 and the controller.

FIG. 9 is a diagram illustrating an example of lamination of the power-supply modules 10*a* to 10*d* illustrated in FIG. 7 and the controller 20. As illustrated in FIG. 9, the power-supply modules 10*a* to 10*d* can be laminated in parallel according to the required power while reducing heat unevenness.

Figure 10:
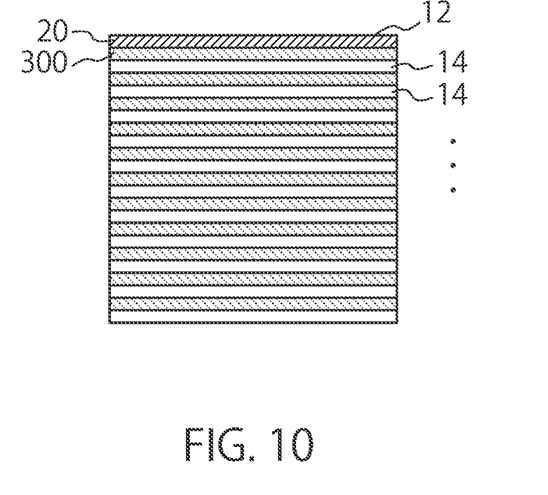
FIG. 10 is a diagram illustrating an example of lamination of capacitors.

FIG. 10 is a diagram illustrating an example of lamination of the capacitors 14. As illustrated in FIG. 10, the controller 20 and the switching circuit 12 are arranged in an uppermost layer. The capacitors 14 are laminated in parallel on a different layer. With this arrangement, the capacity can be changed by changing the number of capacitors 14 to be laminated.

As described above, according to the present embodiment, the switching circuit 12 of the power-supply module 10 are constituted by transistors, and the capacitor 14 is constituted by a silicon capacitor. Accordingly, the switching circuit 12 and the capacitor 14 can be configured to have thicknesses corresponding to each other. Further, the power-supply modules 10 are laminated in parallel. Accordingly, a power-supply module corresponding to a power capacity can be configured more easily.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A DC-DC converter comprising a plurality of power-supply modules respectively connected in parallel and laminated, wherein
the power-supply module comprises:
a capacitor; and
a switching circuit comprising a plurality of switching elements, and configured to charge the capacitor by using an input voltage with a combination of connection and disconnection of the switching elements, and output an output voltage that is different from the input voltage, and
the capacitor is a silicon capacitor, and each of the switching elements is a transistor,
wherein the power-supply modules laminated vertically are arranged in such a manner that the switching circuits are different in position from each other.

2. The converter of claim 1, further comprising a controller laminated on a layer that is different from that of the laminated power-supply modules, and configured to control the switching circuit.

3. The converter of claim 1, wherein
each of the capacitor and the switching elements is configured to have a planar shape, and
a thickness of the capacitor and a thickness of each of the switching elements correspond to each other, and the capacitor and the switching elements are configured on a same substrate or a same film.

4. The converter of claim 3, wherein an output of the switching circuit is connected to an output terminal through a reverse-flow blocking diode.

5. The converter of claim 1, wherein the thickness of the capacitor and the thickness of each of the switching elements are 300 µm or less.

6. The converter of claim 1, wherein
the switching circuit has both ends connected to an output terminal configured to output a DC output voltage, and comprises four switching elements connected in series in order of a first switching element, a second switching element, a third switching element, and a fourth switching element, and
the capacitor is connected between a connecting portion between the first switching element and the second switching element, and a connecting portion between the third switching element and the fourth switching element.

7. The converter of claim 6, wherein the second switching element and the fourth switching element are disconnected and the first switching element and the third switching element are connected after connecting the second switching element and the fourth switching element and disconnecting the first switching element and the third switching element and then charging the capacitor.

8. A DC-DC converter comprising a plurality of power-supply modules connected in parallel, and a controller, wherein
the power-supply module comprises:
a capacitor; and
a switching circuit comprising a plurality of switching elements, and configured to charge the capacitor by using an input voltage with a combination of connection and disconnection of the switching elements, and output an output voltage that is different from the input voltage,
the capacitor is a silicon capacitor, and each of the switching elements is a transistor, and
the controller controls the switching circuit,
wherein the power-supply modules laminated vertically are arranged in such a manner that the switching circuits are different in position from each other.

9. The converter of claim 8, wherein
the controller and the switching circuit are configured in a same layer, and
the capacitor is laminated on a layer that is different from those of the controller and the switching circuit.

10. The converter of claim 9, wherein the capacitor comprises a plurality of capacitors connected in parallel, and the capacitors are laminated on mutually different layers.

11. The converter of claim 8, wherein
each of the capacitor and the switching elements is configured to have a planar shape, and
a thickness of the capacitor and a thickness of each of the switching elements correspond to each other, and the capacitor and the switching elements are configured on a same substrate or a same film.

12. The converter of claim 8, wherein the thickness of the capacitor and the thickness of each of the switching elements are 300 µm or less.

13. The converter of claim 8, wherein
the switching circuit has both ends connected to an output terminal configured to output a DC output voltage, and comprises four switching elements connected in series in order of a first switching element, a second switching element, a third switching element, and a fourth switching element, and the capacitor is connected between a connecting portion between the first switching element and the second switching element, and a connecting portion between the third switching element and the fourth switching element.

14. The converter of claim 13, wherein the second switching element and the fourth switching element are disconnected and the first switching element and the third switching element are connected after connecting the second switching element and the fourth switching element and disconnecting the first switching element and the third switching element and then charging the capacitor.

* * * * *